US007091892B2

(12) United States Patent
Tester et al.

(10) Patent No.: US 7,091,892 B2
(45) Date of Patent: Aug. 15, 2006

(54) METHOD FOR IMPLEMENTATION OF A LOW NOISE, HIGH ACCURACY CURRENT MIRROR FOR AUDIO APPLICATIONS

(75) Inventors: David Tester, Swindon (GB); Gary Hague, Shrivenham (GB); Jorg Medwed, Emmering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 11/008,367

(22) Filed: Dec. 9, 2004

(65) Prior Publication Data

US 2006/0119496 A1 Jun. 8, 2006

(30) Foreign Application Priority Data

Dec. 3, 2004 (EP) ................................. 04368073

(51) Int. Cl.
*H03M 1/00* (2006.01)

(52) U.S. Cl. ...................................... 341/135; 341/136

(58) Field of Classification Search ........ 341/134–136, 341/144–154; 330/254, 257, 258, 288, 303, 330/304

See application file for complete search history.

(56) References Cited

U.S. PATENT DOCUMENTS

| | | | | |
|---|---|---|---|---|
| 4,329,639 | A | 5/1982 | Davis | 323/315 |
| 4,725,791 | A | 2/1988 | Susak et al. | 330/261 |
| 5,212,458 | A | 5/1993 | Fitzpatrick et al. | 330/288 |
| 6,052,074 | A * | 4/2000 | Iida | 341/135 |
| 6,118,395 | A * | 9/2000 | Kim | 341/135 |
| 6,281,751 | B1 * | 8/2001 | Maulik | 330/255 |
| 6,472,858 | B1 | 10/2002 | Tanase | 323/315 |
| 6,486,735 | B1 * | 11/2002 | Phanse et al. | 330/254 |
| 6,518,832 | B1 * | 2/2003 | Enriquez | 327/538 |
| 6,741,195 | B1 * | 5/2004 | Cho | 341/136 |
| 6,825,721 | B1 * | 11/2004 | Sanchez et al. | 330/253 |
| 2004/0188817 | A1 * | 9/2004 | Hua et al. | 257/684 |

FOREIGN PATENT DOCUMENTS

| | | |
|---|---|---|
| JP | 55138865 | 4/1979 |

* cited by examiner

*Primary Examiner*—Linh Nguyen
(74) *Attorney, Agent, or Firm*—Saile Ackerman LLC; Stephen B. Ackerman

(57) ABSTRACT

An accurate high current mirror circuit produces a mirrored current that matches an input current to produce an accuracy at the output of a subsequent stage of amplification of greater than 0.01%. A plurality of transistor devices are arranged in a symmetrical configuration and divided into two groups. The transistors in each of the two groups are connected in parallel to produce a high mirror current from a high input current. A distribution of a source voltage produces the same source voltage at each of the plurality of transistors. An input current metallization and a mirror current metallization are formed within the symmetrical configuration to have a same value of impedance. A plurality of P-channel transistors within the current mirror circuit control a voltage of a point on the input metallization to be the same as a reference voltage, thus causing the mirror current to be referenced around the reference voltage.

29 Claims, 7 Drawing Sheets

METHOD FOR IMPLEMENTATION OF A LOW NOISE, HIGH ACCURACY CURRENT MIRROR FOR AUDIO APPLICATIONS

BACKGROUND OF THE INVENTION

1. Field of Invention

The present invention relates to a current mirror circuit and more particularly a low noise and high accuracy current mirror circuit for audio applications.

2. Description of Related Art

In audio applications such as can be found in mobile phones producing an analog signal from a digital signal that can then be heard by the human ear requires a wide conversion range, i.e. twenty-four bits. This is often done with a current steering circuit where a sigma-delta DAC (digital to analog converter) with a low resolution DAC and a modulator drives a current mirror circuit. The current mirror circuit works in conjunction with the DAC to translate a digital code into a current centered around zero by taking the output from the current mirror circuit, whose input was driven by one output from the DAC and subtract it from the second output current from the DAC. When the output from the current mirror circuit does not perfectly match the input current to the current mirror circuit from the DAC, a residual error current results. The output current from the current mirror and DAC circuit is converted to a voltage that is passed to a substantial gain in subsequent circuitry in the audio signal path. This becomes a problem when there is no digital input signal and the error current is converted to a voltage, which is applied to the sound-producing device and places an added stress on the coils of the earphone or other sound producing devices driven by the subsequent audio circuitry. It is critical that the current steering design have an accuracy, which produces a current when converted to a voltage that is interpreted by the subsequent elements of the audio path as being zero for the digital input code which represents zero. Since the current steering design is a differential output, where the output of the current mirror circuit is subtracted from an output of the DAC, it is critical that the current mirror circuit produce an accurate copy of the input current to the current mirror circuit to minimize or eliminate the error current when there is no digital input to the DAC. Since the current mirror circuit is operating with a high current relative to the desired input referred error current, i.e. in the range of a milliampere for the DC current within the current mirror when there is no digital input signal, there is not only a need for good matching of transistor devices but also a matching of the impedance of metallization carrying the high current and a matching of the values of voltage distributed to the transistor devices. Common elements in the circuitry can be handled by the design, and non-common elements require critical matching so as to produce a proper result in the down stream signal, i.e. zero volts when the digital signal is the code which represents zero.

U.S. Pat. No. 6,472,858 B1 (Tanase) is directed to low voltage fast settling precision current mirrors and methods using a first and a second current mirror circuit where the output of the two current mirrors are coupled such that the output receives a part of the mirrored current from each current mirror. In U.S. Pat. No. 5,212,458 (Fitzpatrick et al.) a current mirror design is directed to a compensation circuit, which automatically adjusts the operating conditions of the current mirror. U.S. Pat. No. 4,329,639 is directed to a high accuracy current mirror circuit comprising low beta transistors and operating on a low supply voltage.

SUMMARY OF THE INVENTION

It is an objective of the present invention to provide a current mirror load operating in conjunction with a DAC that provides an accurate output current that is accurately matched to the current mirror input current.

It is also an objective of the present invention to produce a difference between a DAC current and the current mirror output current that is converted to a voltage, which is interpreted by subsequent circuitry as no input signal.

It is further an objective of the present invention to provide a current mirror circuit that produces a high current output, which matches a high current input with a high level of accuracy.

It is also further an objective of the present invention to provide a current mirror circuit that has a symmetrical design in which a plurality of transistor devices connected in parallel collectively produce a high current and in which are all transistor devices are biased with the same value of a source voltage.

It is still further an objective of the present invention to match the impedance of the high current input and output metallization of the current mirror circuit.

It is still another objective of the present invention to produce an output current from the current mirror circuit where the output current matches the input current with an accuracy greater than 0.01%.

In the present invention a digital input signal is converted to an analog output voltage. The output voltage is amplified and coupled to a sound apparatus to produce a voice response to the digital signal. A digital to analog converter (DAC) might be implemented as a current steering circuit in which a sigma delta DAC produces two high amplitude current signals. A first of the two DAC high current signals is coupled to a current mirror circuit, which produces an accurate copy of the first of the two DAC high current signals. The accurate copy of the first of the two DAC high current signals is subtracted from the second DAC output current, and the result is input to a current to voltage converter. The current to voltage converter couples an analog audio signal to an amplifier through a low pass filter.

When there is no digital input signal to the DAC, it is important that the output of the amplifier is at it's quiescent bias point, which in turn does not put undue stress on the speaker device connected to the output of the amplifier. Slight differences in the output current of the current mirror circuit from the input current will cause a substantial error signal at the output of the amplifier, when connected in a high gain configuration, and when the digital input signal to the DAC corresponds to the zero level code. This amplified error signal in turn places a stress on the audio speakers.

In the present invention the error signal problem is substantially reduced or eliminated by accurately matching the high output current of the current mirror circuit to the high input current so that a zero audio signal is produced when the code input to the DAC corresponds to a zero level. To accomplish this, the high current circuitry of the current mirror is formed in a symmetrical array of N-channel transistor devices. The array of N-channel transistor devices is divided into two groups, a first group for handling input current from the DAC and a second group for providing an output current of the current mirror circuit. The two groups of N-channel transistor devices are distributed and intermingled within the array of N-channel transistor devices in a checkerboard fashion. The distributed checkerboard fashion allows the composite of all transistor devices in each group to smooth, or average out process variations in the transistor devices. All of the N-channel transistor devices in the first group are connected in parallel, wherein all gates are connected together, all drains are connected together and all sources are connected together. In like manner all N-channel transistor devices in the second group are connected in parallel, wherein all gates are connected together, all drains are connected together and all sources are connected together.

A symmetrical source voltage distribution network is positioned over the symmetrical array of N-channel transistors and is connected to all the sources in the array of N-channel transistors such that the same voltage value is connected to each source. A metallization carrying the source voltage to the array of N-channel transistor devices is connected to the symmetrical source voltage distribution network at a central point in the network, thus allowing the distribution network to supply each source of the N-channel transistors of the two groups of N-channel transistors with the same source voltage. The metallization carrying the source voltage to the source voltage distribution network and the source voltage distribution network are formed with wide high current carrying metallization providing sufficiently low impedance.

The input current path to the current mirror from the DAC and the output current path from the current mirror are formed with wide high current carrying metallization to have equal impedance so that the same voltage drops occur in each path. A plurality of vias between metallization on different wiring layers of the semiconductor device are used to further minimize resistance of the high current carrying paths and to reduce effects of temperature on the resistance of a particular high current path. This is important because the matching of vias is often uncontrolled or poorly controlled. The difference between the two currents is sensitive to variations in the high current output of the current mirror circuit. The output of the current mirror is centered around a reference voltage so that a negative digital input to the DAC can be coupled to the amplifier through the analog circuitry as a signal below the reference voltage. When there is no digital input signal to the DAC, the reference voltage is coupled to the amplifier and no analog error signal is coupled to the speaker mechanism. The techniques of the present invention provide a matching of the mirror current to the input current to which is produced an amplified accuracy at the amplifier greater than 0.01% when referred to the input signal level of the current mirror and herein called input referred accuracy.

It should be noted that although N-channel transistor devices are used in the high current circuitry and the current mirror circuit along with P-channel transistor devices, the circuitry of the present invention can be created using P-channel transistor devices in place of the N-channel devices and N-channel devices in place of the P-channel devices. Also it should be noted that the techniques of the present invention are applicable to circuitry formed from bipolar transistor devices and any other devices that convert digital signals to analog signals, provide gain and route current.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
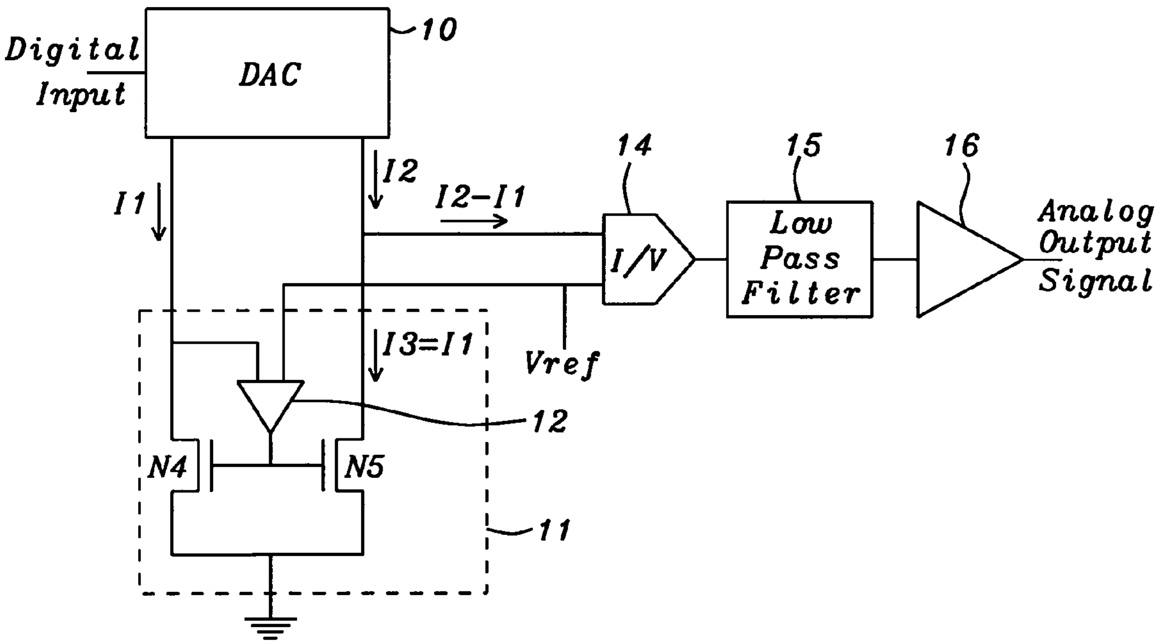
FIG. 1 is a circuit diagram of the present invention showing an audio DAC containing a current mirror circuit.

In FIG. 1 is shown the circuitry of the present invention to convert a digital signal to audio analog signal. A digital input signal is connected to a DAC 10, which is a current steering sigma delta DAC that produces two currents, I1 and I2 that are a function of the digital input, where I2 is approximately twice the magnitude of I1. Other DAC designs that produce similar currents are within the scope of this invention. The current I1 forms an input to the current mirror circuit 11. The current mirror circuit is symbolized by an amplifier 12, which drives the gates of two N-channel transistors, N4 and N5. The output current of the current mirror circuit is I3 where I3=I1. The amplifier 12 and a current to voltage converter 14 are connected to a reference voltage Vref around which the current, I2−I3=I2−I1, flows into the current to voltage converter. The currents I1, I2 and I3 are high currents, for example in the milliampere range but are not limited to this range. The reference voltage allows currents representing both positive and negative digital input signals to be converted to a voltage by the current to voltage converter 14.

The current to voltage converter 14 couples a voltage representing the digital input signal to an amplifier 16 through a low pass filter 15. The analog output signal of the amplifier 16 then drives and earphone or similar sound-producing device and has a high gain, for example greater than 20 db. Since the mirror current I3 is subtracted from the DAC current I2, which is approximately twice I1, it is critical that I3 accurately represent I1. When the digital input signal is zero, any differences (error current) between I1 and I3 is converted to a voltage and amplified by the subsequent circuit gain represented by amplifier 16. The effect of the error current is to put additional stress on the coils of the earphone or similar device when the digital input signal is zero.

Figure 2:
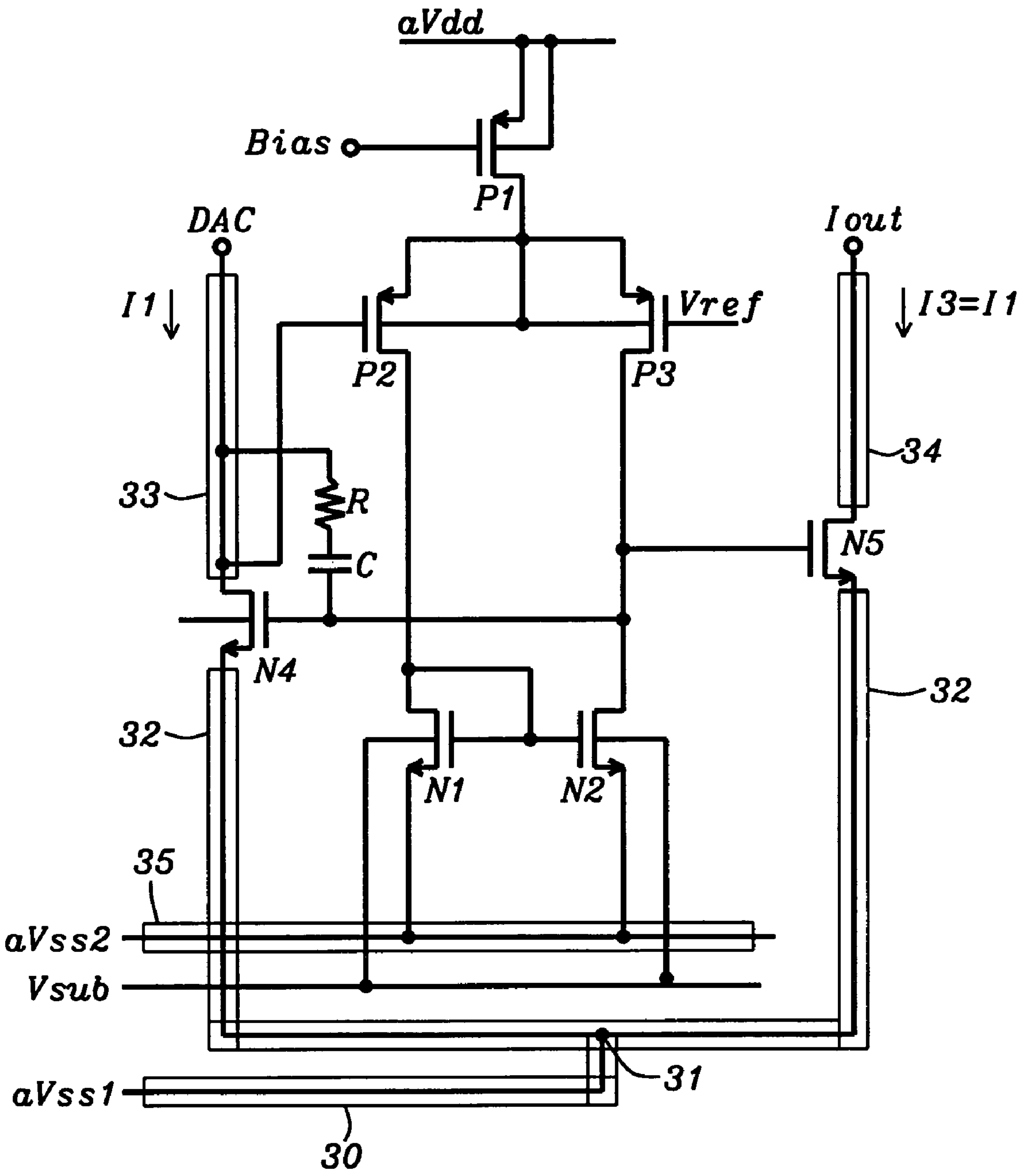
FIG. 2 is a circuit diagram of the present invention of a current mirror circuit with a high current input and output circuitry.

In FIG. 2 is shown a schematic of the current mirror circuit of the present invention. The core of the current mirror circuit is formed with P-channel transistor devices P2 and P3 connected to N-channel transistor devices N1 and N2. A bias transistor P1 connects the voltage aVdd to the current mirror circuit and a source voltage aVss2 connected to the sources of N1 and N2 with a wide, low resistance metallization 35 and Vsub is connected to the substrate of transistor devices N1 and N2. The P-channel transistors P2 and P3 are each formed with a plurality of transistor devices connected in parallel to provide composite devices in which semiconductor process variations are averaged (smoothed) to provide a more consistent and matched pair of equivalent devices. High current N-channel devices symbolized by N4 and N5 provide the high current carrying capability of the current mirror.

The high current devices symbolized by N4 and N5 are each a composite device of a plurality of N-channel transistor device connected in parallel such that the drains, sources and the gates of the N channel transistor devices devices are connected in parallel in each of the N4 and N5 composite devices. A common high current connection of the source voltage aVss1 30 is connected to a central point 31 from which a high current metallization 32 connects to the sources of the devices forming N4 and N5 in such a manner that the same source voltage is applied to the source of all the devices that form N4 and N5. A first high current metallization 33 connects 11 from the DAC 10 (FIG. 1) and a second high current metallization 34 connects a mirror current I3, where I3=I1, to subsequent circuitry for converting the digital input signal to the DAC 10 to an analog voltage signal at the output of the amplifier 16 (FIG. 1). The first and second high current metallization 33 and 34 are configured such that the impedance to current flow I1 and the impedance to current flow I3 are equal.

The gate to the P-channel transistor P2 is connected to the high current metallization 33 at a point near a central distribution point of the high current metallization connected to the drains of the N-channel transistor devices forming N4. This allows the amplifier formed by P-channel transistor devices P2 and P3 to control the drain voltage of N4 to a reference voltage Vref that is connected to the gate of the P-channel transistor device P3. A resistor R and capacitor C network is connected between the drains and the gates of N4 to provide circuit stability.

Figure 3:
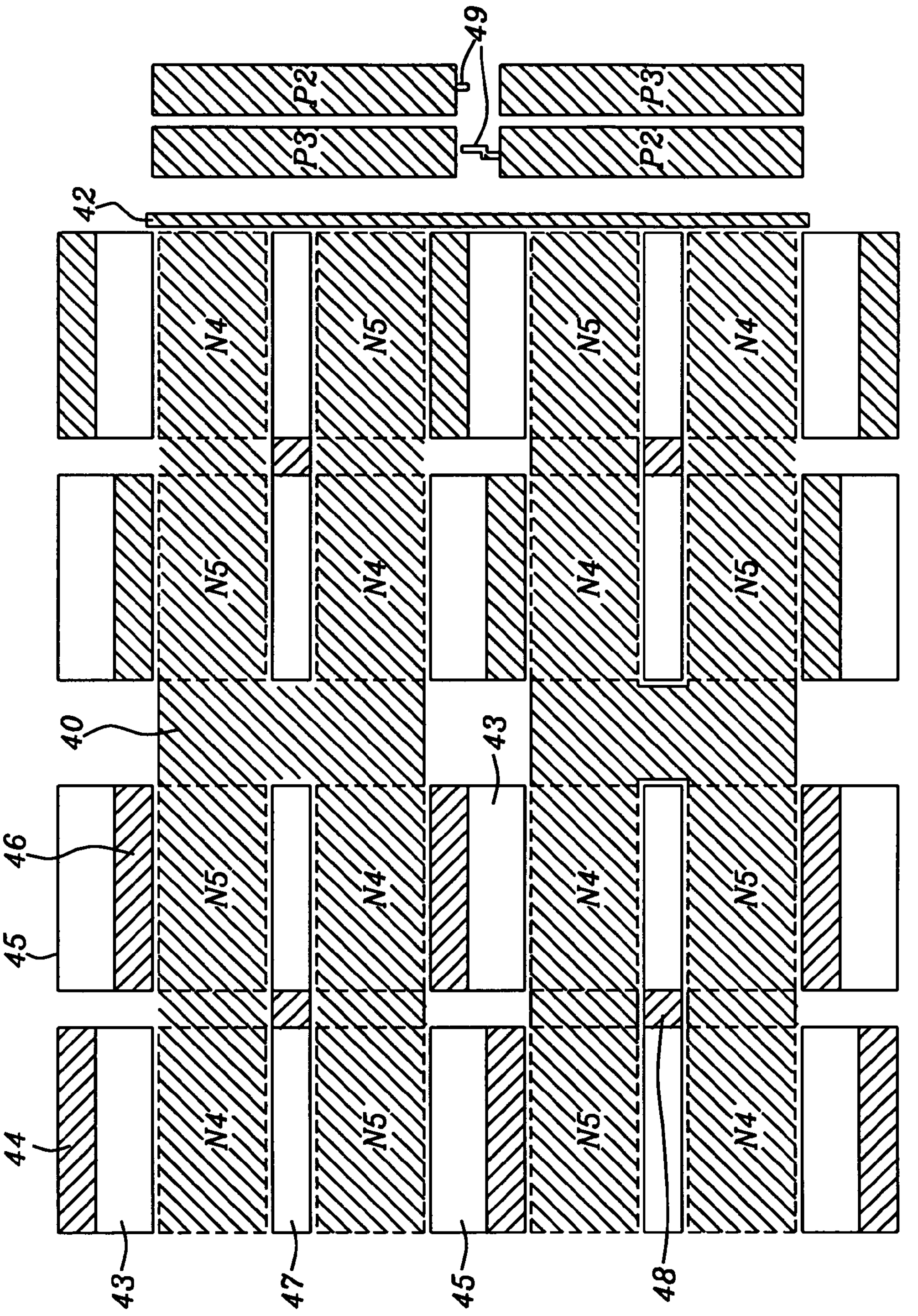
FIG. 3 is a plan view of the first level metal of an array of transistor devices used in the present invention to create the high current circuitry of the current mirror circuit.

In FIG. 3 is shown the first level metal layout of the plurality of N-channel transistor devices forming the composite parallel-connected devices that form N4 and N5 and the P-channel transistor devices forming the composite parallel-connected devices that form P2 and P3. The N-channel devices forming N4 and N5 are intermingled in a symmetrical checkerboard fashion so as to average (smooth) the effects of process variations on the individual devices, and to provide a configuration that can be interconnected with high current metallization that creates a same source voltage at each device as well as input and output high current connections of equal impedance. The P-channel devices P2 and P3 are also distributed in a checkerboard fashion to provide an averaging of the process variations on each device. Additional P2 and P3 devices can be added and distributed in a checkerboard fashion as shown to produce well defined composite P-channel transistors P2 and P3 by connecting all gates in parallel, all drains in parallel and all sources in parallel within each composite group.

A polysilicon layer 40 forms the gates of N-channel devices N4 and N5 and a polysilicon layer 41 forms the gates of the P-channel devices P2 and P3. A strip of polysilicon 42 connects the polysilicon gates of N4 and N5. A first level metal 43 connects to the drains of N4 and a first level metal 45 connects to the drains of N5. On the first level metal 43 connecting to the drains of N4 and N5 are shown areas 44 and 46 where a plurality of vias are used to connect to the second level metal. The use of a plurality of vias is necessary to maintain a low impedance in the routing of the high current metallization. Between alternate rows of N4 and N5 devices is a first level metal 47 that connects to the sources of the transistor devices N4 and N5. Centered in each strip of the metallization 47 is an area 48 where a plurality of vias are used to connect to the subsequent layers of metallization. The P-channel transistors P2 are shown with a short segment of minimum pitch metal 49 that is used to connect the gates of the P2 transistor devices. These short segments form a part of the connection of P2 to the drains of N4.

Figure 4:
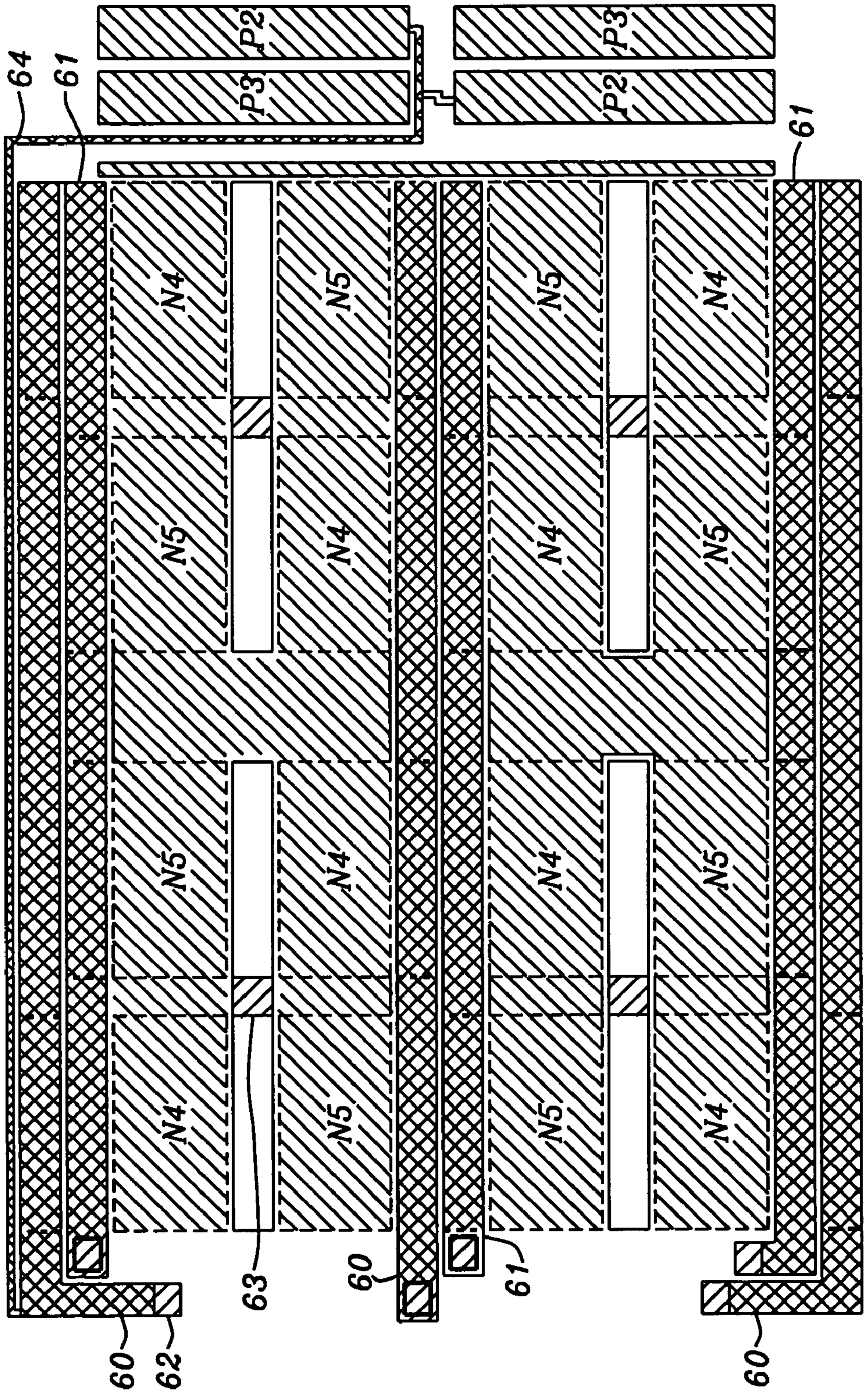
FIG. 4 is a plan view of the second level metal of the array of transistor devices used in the present invention to create the high current circuitry of the current mirror circuit.

In FIG. 4 is shown the second level metal overlaying the first level metal of the symmetrical arrangement of the N-channel devices N4 and N5. A wide metallization 60 connects to the drains of N4 through the plurality of vias 44 (FIG. 3) and a wide metallization 61 connects to the drains of N5 through the plurality of vias 46 (FIG. 3). Areas 62 at the ends of the wide metallization 60 and 61 provide a plurality of vias to connect to the third level of metal. An area 63 provides a plurality of vias to connect the source metallization 47 (FIG. 3) to the third level of metal. A minimum pitch metal 64 connects the gates of the P2 transistor devices to the wide metallization connected to the drains of the N4 transistor devices.

Figure 5:
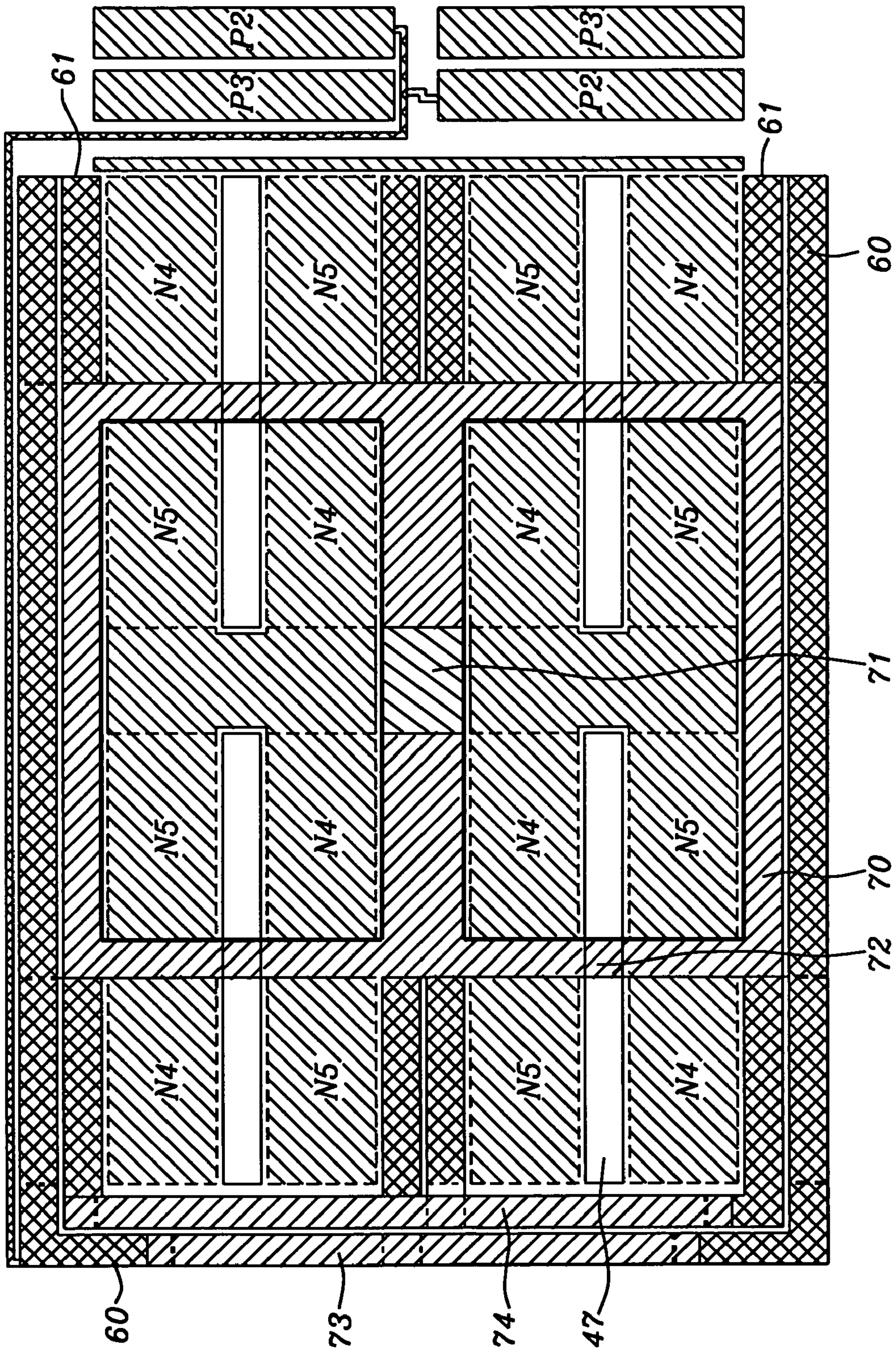
FIG. 5 is the plan view of the third level metal of the array of transistor devices used in the present invention to create the high current circuitry of the current mirror circuit.

In FIG. 5 is shown the third level metal overlaying the symmetrical arrangement of the N-channel devices N4 and N5. A source voltage distribution metallization 70 is centrally located over the array of N-channel devices N4 and N5. An area 71 in the center of the source voltage distribution metallization provides a plurality of via connections to the fourth level of metallization. The first level source voltage metallization 47 is connected to the source voltage distribution metallization 70 through a plurality of intermetal vias 72 between each subsequent layers of metallization (plurality of vias 63 in FIG. 4 and plurality of vias 48 in FIG. 3). The design of the source voltage distribution metallization provides the same source voltage value at the sources of each of the N-channel transistors N4 and N5.

Continuing to refer to FIG. 5, a wide high current metallization 73 connects together the wide metallization 60 (FIG. 4) through a plurality of vias 62 (FIG. 4), which allows all drains of N4 to be connected together and share current I1 (FIG. 2). A wide high current metallization 74 connects together the wide metallization 61 (FIG. 4) through a plurality of vias 62 (FIG. 4), which allows all drains of N5 to be connected together and share current I3 (FIG. 2). The use of a plurality of vias 62 to interconnect the metallization on different wiring layers allows the same impedance to high current for I1 and I3 into and out of the current mirror circuit 33 and 34 (FIG. 2).

Figure 6:
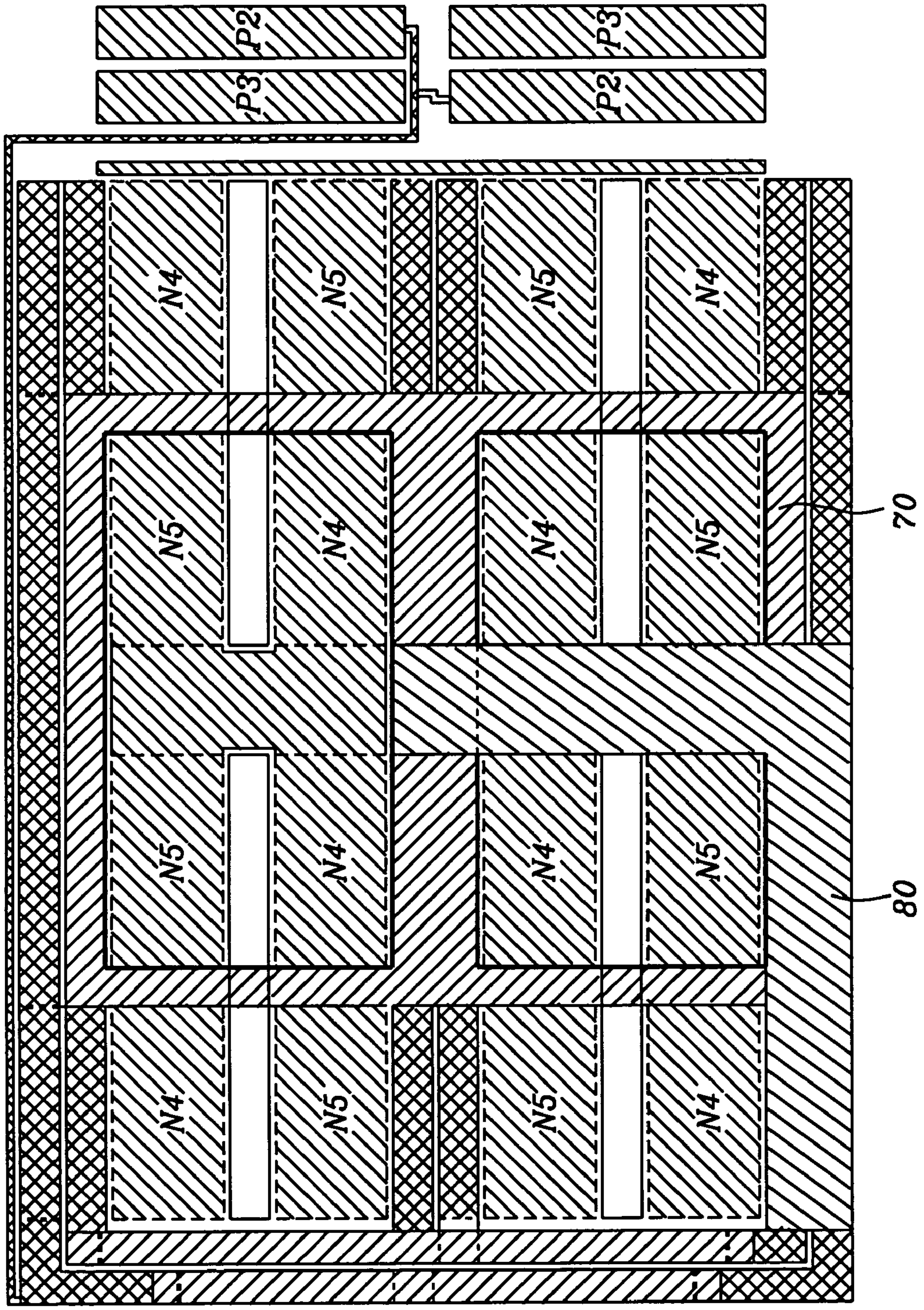
FIG. 6 is the plan view of the fourth level metal of the array of transistor devices used in the present invention to create the high current circuitry of the current mirror circuit.

In FIG. 6 is shown a portion of fourth level metal over the array of N4 and N5 devices. A source voltage metallization 80, common to the sources of both N4 and N5 is connected to the symmetrical source voltage distribution metallization 70 through a plurality of vias 71 (FIG. 5). The metallization 80, 70 and 47 and the plurality of vias 71, 72, 63 and 48 that distributes the source voltage to the sources of the N-channel devices N4 and N5 provides the means by which the same source voltage value is connected to all the sources of the plurality of transistor devices, which form the high current devices N4 and N5 of the current mirror circuit.

Figure 7:
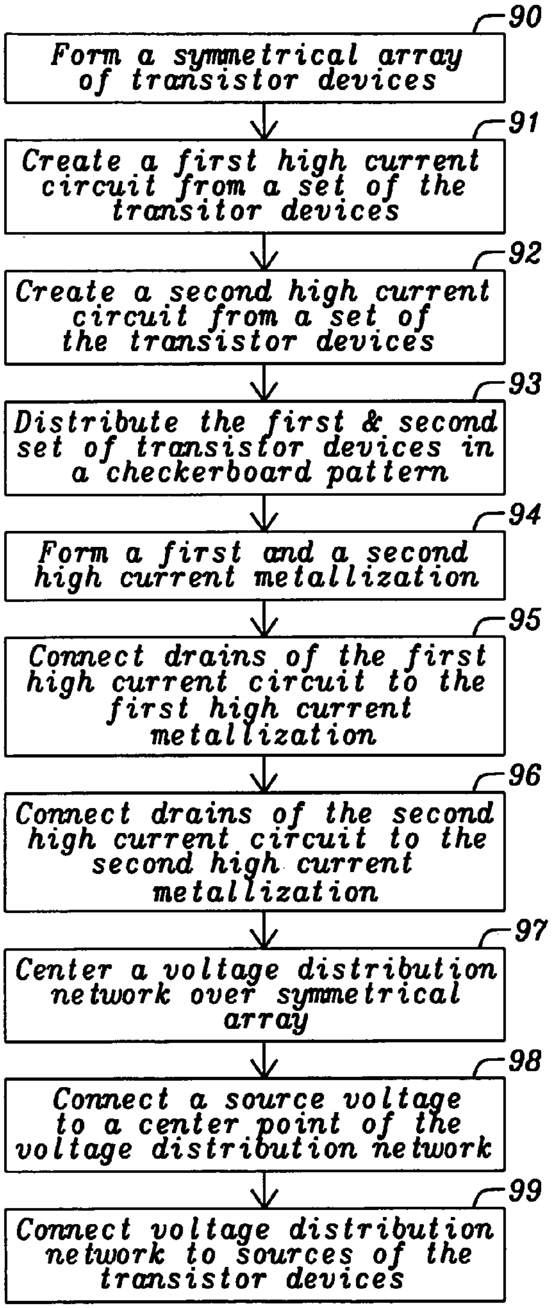
FIG. 7 is a method of the present invention for creating the high current circuitry of the current mirror circuit.

In FIG. 7 is shown a method of the present invention for creating the high current circuitry of the current mirror. A symmetrical array of N-channel transistor devices is formed on a semiconductor substrate 90. A first set of high current circuit is formed from a plurality of the N-channel transistor devices 91 by connecting the devices of the first set in parallel. A second set of high current circuit is formed from a plurality of the N-channel transistor devices 92 by connecting the devices of the second set in parallel. The first and the second set of N-channel transistor devices are distributed in a symmetrical checkerboard pattern 93 around a central point. The checkerboard pattern allows the effects of semiconductor process variations to be averaged thereby forming a first and second set of transistors that have a composite characteristic that is as nearly matched as possible. A first and a second high current metallization 94 are formed in which the impedance of the first and second high current metallization is equal. The drains of the first set of transistor devices are connected to the first high current metallization 95, and the drains of the second set of transistor devices are connected to the second high current metallization 96. A voltage distribution network is centered over the symmetrical array of transistor devices 97. A source voltage is connected to a center point of the voltage distribution network 98 and the voltage distribution network is connected to all transistor devices in the symmetrical array of transistor devices 99 in a manner by which the same source voltage value is connected to each source of the symmetrical array of transistor devices. The method describe for FIG. 7 allows a current mirror circuit to accurately copy an input current of high magnitude by minimizing impedance differences, minimizing process variations in the transistor devices of composite high current circuitry, and providing a same source voltage value to all the transistor devices that make up the first and second high current circuits of the current mirror circuit.

Figure 8:
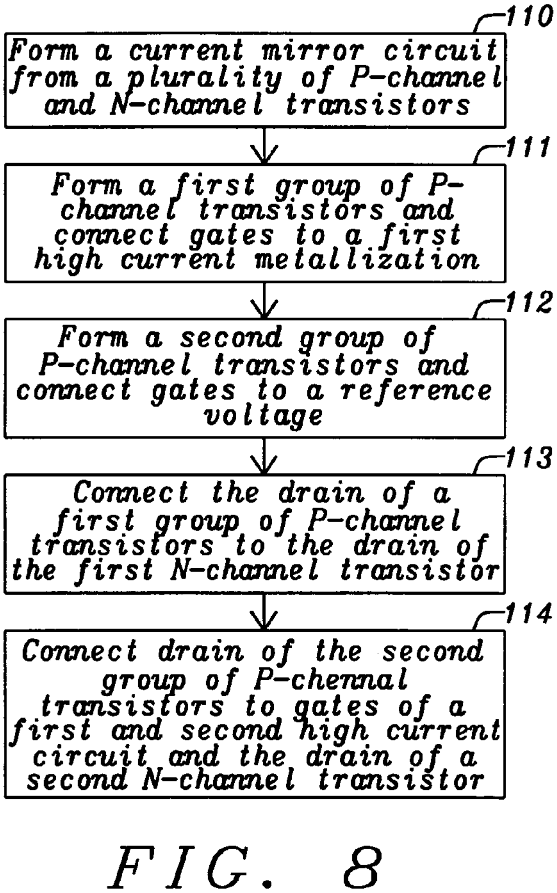
FIG. 8 is a method of the present invention for connecting the bias transistors of the current mirror circuit to the high current circuitry connected to the current mirror.

In FIG. 8 is a method of the present invention for connecting the bias transistors of the current mirror circuit to the high current circuitry of the current mirror. A current mirror circuit is formed from a plurality of P-channel and N-channel transistor devices 110. A first group of P-channel transistors is formed and connected in parallel, whereby the gates of the P-channel transistor devices in the first group are connected to a first high current metallization connected to a first high current circuit of the current mirror circuit 111. A second group of P-channel transistor devices is formed and connected in parallel, whereby the gates of the P-channel transistor devices in the second group are connected to a reference voltage 112. The connection of the gates of the first group of P-channel transistors to the first high current metallization controls the current mirror circuit to produce a voltage on the first high current metallization equal to the reference voltage. The first and second groups of P-channel transistor devices are arranged on the semiconductor substrate in a checkerboard fashion whereby process variations of the transistor devices are averaged, producing a more consistent composite first and second groups of transistor devices. The drain of the first group of P-channel transistor devices (P2, FIG. 2) is connected to a drain of the first N-channel transistor (N1, FIG. 2) of the current mirror circuit 113, and the drain of the second group of P-channel transistor devices (P3, FIG. 2) is connected to gates of a first and a second high current circuit (N4 and N5, FIG. 2) and to the drain of the second N-channel transistor device (N2, FIG. 2) of the current mirror circuit 114.

It should be noted that the circuitry and metallization networks describe herein can be applied to circuitry where N-channel transistor devices replace the P-channel transistor devices of the present invention and P-channel transistor devices replace the N-channel transistor devices of the present invention. Further it should be noted that bipolar devices and/or other devices producing voltage, current, or other forms of energy, and gain can be used to replace the function of the N-channel and P-channel devices of the present invention.

While the invention has been particularly shown and described with reference to preferred embodiments thereof, it will be understood by those skilled in the art that various changes in form and details may be made without departing from the spirit and scope of the invention.

What is claimed is:

1. An accurate high current circuit, comprising:

a) a current mirror circuit;

b) a first high current circuit comprising a first plurality of transistor devices connected in parallel and a second high current circuit comprising a second plurality of transistor devices connected in parallel;

c) a first high current interconnect metallization connected to the first plurality of transistor devices to receive an input current and a second high current interconnect metallization connected to the second plurality of transistor devices to connect from the second high current circuit an output current equal to said input current;

d) a source voltage distribution circuit distributing a same value of said source voltage to a symmetrical array of transistor devices comprising the first plurality of transistor devices and the second plurality of transistor devices; and e) said current mirror circuit coupled to said first and second high current circuit controlling the first plurality of transistors devices to have a drain voltage equal to a reference voltage and produces from the second plurality of transistor devices said output current centered around the reference voltage.

2. The circuit of claim 1, wherein said first high current interconnect metallization and said second high current interconnect metallization are metallization formed on a semiconductor substrate to create an impedance of the first high current interconnect metallization that matches the impedance of the second high current interconnect metallization.

3. The circuit of claim 1, wherein said first plurality of transistor devices and said second plurality of transistor devices are intermingled and distributed in said symmetrical array on a semiconductor substrate in a checkerboard fashion around a central source voltage distribution point.

4. An accurate high current circuit, comprising:

a) a current mirror circuit;

b) a first high current circuit and a second high current circuit;

c) a first high current metallization and a second high current metallization;

d) a source voltage distribution circuit;

e) said current mirror circuit coupled to said first and second high current circuit;

f) said first high current metallization coupled to an output of the first high current circuit and said second high current metallization coupled to the output of the second high current circuit; and g) said source voltage distribution circuit distributes a same value of source voltage to the first high current circuit and the second high current circuit;

h) said first high current circuit and said second high current circuit each comprise a plurality of transistor devices intermingled and distributed in an array on a semiconductor substrate in a checkerboard fashion around a central source voltage distribution point; and i) said plurality of transistor devices of said first high current circuit are connected in parallel, whereby drains of said plurality of transistor devices are coupled together, gates of said plurality of transistor devices are coupled together and sources of said plurality of transistor devices are coupled together, and thereby producing said first high current circuit.

5. The circuit of claim 4, wherein said plurality of transistor devices of said second high current circuit are connected in parallel, whereby drains of said plurality of transistor devices are coupled together, gates of said plurality of transistor devices are coupled together and sources of said plurality of transistor devices are coupled together, and thereby producing said second high current circuit.

6. The circuit of claim 4, wherein said checkerboard fashion averages process variations between said plurality of transistor devices.

7. The circuit of claim 4, wherein said plurality of transistor devices in said first high current circuit is eight, and said plurality of transistors in said second high current circuit is eight.

8. The circuit of claim 4, wherein said plurality of transistor devices in said first high current circuit is fewer than eight, and said plurality of transistors in said second high current circuit is fewer than eight.

9. The circuit of claim 4, wherein said source voltage distribution circuit distributes a same value of source voltage to the sources of said plurality of transistor devices from the central source voltage distribution point centered in the array of said plurality of transistor devices.

10. The circuit of claim 1, wherein said current mirror circuit further comprises a plurality of P-channel devices coupled to a plurality of N-channel devices in which the plurality P-channel devices are divided into a first parallel group and a second parallel group whereby the gates of the first parallel group are connected to drains of the first plurality of transistor devices of the first high current circuit and the gates of the second parallel group are connected to said reference voltage to control the output current to be centered around said reference voltage.

11. The circuit of claim 10, wherein said first parallel group and said second parallel group of P-channel devices are placed on a semiconductor substrate in a checkerboard arrangement to allow averaging of semiconductor process variations.

12. An audio digital to analog circuit, comprising:

a) a digital to analog converter (DAC);

b) a current mirror circuit;

c) a current to voltage converter;

d) a low pass filter circuit;

e) an amplifier circuit;

f) said DAC produces a first current coupled to said current mirror circuit and a second current from which a mirror current of the first current is subtracted forming a third current coupled to said current to voltage converter; and g) said current to voltage converter couples a voltage conversion of said third current centered around a reference voltage to said amplifier through the low pass filter.

13. The circuit of claim 12, wherein said first current, said mirror current and said second current are high currents in a magnitude range of approximately a milliampere.

14. The circuit of claim 13, wherein said first current and said mirror current are a same value of current to within an accuracy which produces an amplified accuracy at an output of said amplifier with an input referred accuracy greater than approximately 0.01%.

15. The circuit of claim 12, wherein said DAC is a sigma delta DAC.

16. The circuit of claim 12, wherein said current mirror circuit and said current to voltage converter are referenced to a voltage about which a digital signal input to the DAC converted to an analog output is centered.

17. A method for creating an accurate mirror current in a current mirror circuit, comprising:

a) forming a symmetrical array of transistor devices;

b) creating a first high current circuit from a first set of said transistor devices;

c) creating a second high current circuit from a second set of said transistor devices;

d) distributing said transistor devices of the first and second high current circuits in a checkerboard pattern within said symmetrical array;

e) forming a first high current metallization and a second high current metallization whereby said first high current metallization has an impedance equal to said impedance of said of said second high current metallization;

f) connecting said first high current metallization to drains of said transistor devices of said first high current circuit;

g) connecting said second high current metallization to drains of said transistor devices of said second high current circuit;

h) centering a voltage distribution network over said symmetrical array of transistors;

i) connecting a source voltage to a center point of said voltage distribution network; and j) connecting said voltage distribution network to sources of said transistor devices in a distributed manner so as to produce a same value of source voltage at each of said transistor devices.

18. The method of claim 17, wherein said first high current circuit comprises a plurality of transistor devices connected in parallel such that drains are connected together, sources are connected together and gates are connected together.

19. The method of claim 17, wherein said second high current circuit comprises a plurality of transistor devices connected in parallel such that drains are connected together, sources are connected together and gates are connected together.

20. The method of claim 17, wherein distributing said transistor devices in a checkerboard pattern averages effects of semiconductor process variations in said transistor devices.

21. The method of claim 17, wherein said first high current metallization and said second high current metallization are formed to have a same value of impedance.

22. A method of connecting an accurate current mirror circuit to high current circuits, comprising:

a) forming a current mirror circuit containing a plurality of P-channel transistor devices and a plurality of N-channel transistor devices;

b) forming a first group of said plurality of P-channel transistor devices and connecting gates of said first group to a high current metallization connected to a drain of a first high current circuit;

c) forming a second group of said plurality of P-channel transistor devices and connecting gates of said second group to a reference voltage; and d) connecting gates of the first high current circuit and gates of a second high current circuit to drains of the second group, thereby controlling the second high current circuit to produce a current centered around said reference voltage.

23. The method of claim 22, wherein forming said first group and said second group of P-channel transistors is in an array of said P-channel transistors distributed so as to form a checkerboard like pattern to provide an averaging of process variations of said P-channel devices.

24. A method of connecting an accurate current mirror circuit to high current circuits, comprising:

a) forming a current mirror circuit containing a plurality of P-channel transistor devices and a plurality of N-channel transistor devices;

b) forming a first group of said plurality of P-channel transistor devices and connecting gates of said first group of said plurality of P-channel devices to a high current metallization connected to a drain of a first high current circuit;

c) forming a second group of said plurality of P-channel transistor devices and connecting gates of said second group to a reference voltage;

d) connecting gates of the first high current circuit and gates of a second high current circuit to drains of the second group of said plurality of P-channel transistor devices; and e) connecting said gates of the first group of P-channel transistor devices to said high current metallization connected to the drain of the first high current circuit is made at a point on said high current metallization to produce a voltage at said point equal to the reference voltage.

25. A high current circuit producing an output current equal to an input current, comprising:

a) a means for creating a high current input circuit and a high current output circuit;

b) a means for sensing an input current and creating an accurate copy of said input current at an output of said high current output circuit;

c) a means for laving out and interconnecting a first parallel connected plurality of transistor devices forming said high current input circuit and a second parallel connected plurality of transistor devices forming said high current output circuit to produce an output current that is equal to said input current; and d) a means for controlling said high current input circuit to produce said output current referenced around a reference voltage.

26. The high current circuit of claim 25, wherein said means for creating a high current input circuit and a high current output circuit further comprises:

a) a means for connecting a same value of a source voltage to each transistor of said first and said second parallel connected plurality of transistor devices; and b) a means for connecting a first high current metallization to drains of each said transistor of the first parallel connected plurality of transistor devices with a same value of impedance as a second high current metallization connected to drains of each transistor of the second parallel connected plurality of transistor devices.

27. The high current circuit of claim 25, wherein said means for sensing a high input current is a current mirror circuit.

28. The high current circuit of claim 27, wherein said means for sensing said high input current further comprises a plurality of P-channel transistor devices in said current mirror circuit that sense a voltage at a point in said first high current metallization, compares said voltage to a reference voltage and controls said high current output circuit to produce said accurate copy of the high input current centered around said reference voltage at said output of the high current output circuit.

29. The high current circuit of claim 28, wherein said accurate copy of said high input current further comprises;

a) a DAC producing said high input current;

b) a digital input signal to said DAC varying from a positive value to a negative value;

c) said accurate copy referenced to a reference voltage and subtracted from two times said high input current to create an input to a current to voltage converter which is further coupled to subsequent stages of gain;

d) a zero value digital input signal coupled to said DAC creating a zero value analog signal at an output of said subsequent stages of gain.

* * * * *